US011480480B2

(12) United States Patent
Ollier et al.

(10) Patent No.: US 11,480,480 B2
(45) Date of Patent: Oct. 25, 2022

(54) THERMAL FLUX SENSOR WITH HEATING NANOFILAMENTS (71) Applicants: COMMISSARIAT A L'ENERGIE ATOMIQUE ET AUX ENERGIES ALTERNATIVES, Paris (FR); Apix Analytics, Grenoble (FR)

(72) Inventors: Eric Ollier, Grenoble (FR); Thomas Alava, Grenoble (FR); Kévin Benedetto, Grenoble (FR); Carine Ladner, Grenoble (FR); Eric Colinet, Grenoble (FR)

(73) Assignees: COMMISSARIAT A L'ENERGIE ATOMIQUE ET AUX ENERGIES ALTERNATIVES; Apix Analytics ( * ) Notice: Subject to any disclaimer, the term of this patent is extended or adjusted under 35 U.S.C. 154(b) by 508 days.

(21) Appl. No.: 16/705,405

(22) Filed: Dec. 6, 2019

(65) Prior Publication Data
US 2020/0182711 A1 Jun. 11, 2020

(30) Foreign Application Priority Data

Dec. 7, 2018 (FR) ...................................... 1872516

(51) Int. Cl.
G01K 17/06 (2006.01)
B81B 7/00 (2006.01)
(52) U.S. Cl.
CPC ............. G01K 17/06 (2013.01); B81B 7/008 (2013.01); B81B 2201/0271 (2013.01)
(58) Field of Classification Search
CPC ............. G01K 17/06; B81B 7/008; B81B 2201/0271; G01N 2291/02881; G01N 2291/0427; G01N 29/036; G01N 29/022
See application file for complete search history.

(56) References Cited

U.S. PATENT DOCUMENTS 8,313,236 B2 11/2012 Barth
2014/0076024 A1 3/2014 Duraffourg et al.
(Continued)

FOREIGN PATENT DOCUMENTS

EP 2711696 A1 3/2014
FR 2995690 A1 3/2014
(Continued)

OTHER PUBLICATIONS

Preliminary Search Report with Written Opinion for French Application No. 1872516 dated Nov. 6, 2019, 6 pages.
(Continued)

Primary Examiner — Elias Ullah
(74) Attorney, Agent, or Firm — Lerner, David, Littenberg, Krumholz & Mentlik, LLP (57) ABSTRACT A heat flux sensor comprising:
an array of nanofilaments suspended with respect to a support, each nanofilament comprising an electrically conducting material, the array being able to be biased by an electric power source to circulate an electric current in each of the nanofilaments,
at least one resonator of the nanoelectro-mechanical system (NEMS) type comprising:
a beam consisting of a nanofilament forming a side of the array,
an actuation device able to generate a vibration of the beam under the effect of an excitation signal,
a detection device configured to measure a displacement of the beam during the vibration and emit an output signal having a resonance at the resonant frequency of the resonator, the resonant frequency depending on the intensity of the electric current flowing through the beam, a temperature variation of the array of heating nanofilaments induced by a
(Continued)

variation in a characteristic of a fluid surrounding the array causing an intensity variation of the current flowing through the beam resulting in a variation in the resonant frequency of the resonator.

22 Claims, 6 Drawing Sheets

(56) References Cited

U.S. PATENT DOCUMENTS

| | | |
|---|---|---|
| 2014/0079091 A1 | 3/2014 | Ruellan et al. |
| 2015/0247828 A1 | 9/2015 | Ruellan et al. |
| 2015/0300999 A1 | 10/2015 | Andreucci et al. |
| 2015/0316517 A1 | 11/2015 | Ollier et al. |

FOREIGN PATENT DOCUMENTS

| | | |
|---|---|---|
| FR | 2995691 A1 | 3/2014 |
| FR | 2995692 A1 | 3/2014 |
| FR | 2996219 A1 | 4/2014 |
| FR | 3008690 A1 | 1/2015 |
| WO | 2015082956 A1 | 6/2015 |

OTHER PUBLICATIONS

Xu Weihong, et al., "Fabrication of Prototypal Nanomechanical Resonator Based on a Single Copper Nanowire", 2013 IEEE International Conference on Green Computing and Communications and IEEE Internet of Things and IEEE Cyber, Physical and Social Computing, IEEE, Aug. 20, 2013, pp. 1706-1709, XP032530574.

THERMAL FLUX SENSOR WITH HEATING NANOFILAMENTS

CROSS-REFERENCE TO RELATED APPLICATIONS

This application claims priority from French application number 1872516, filed Dec. 7, 2018, the disclosure of which is hereby incorporated herein by reference.

FIELD OF THE INVENTION

The present invention relates to a heat flux sensor with heating nanofilaments. Such a heat flux sensor can find an application in particular in a gas sensor, a gas analysis system or a flowmeter.

STATE OF THE ART

A heat flux sensor enables a heat exchange between the body of the sensor and its surrounding environment to be measured. The surrounding environment can be a gas or liquid medium. This approach can be used to make for example a gas sensor or a pressure sensor.

A gas sensor of the TCD (Thermal Conductivity Detector) type operates on the principle of measuring the electric resistance of a wire the temperature of which varies as a function of heat exchanges with a surrounding gas through the thermal conductivity of said gas. Such a sensor is described in particular in document U.S. Pat. No. 8,313,236.

Such a sensor can be arranged at the outlet of a gas chromatography column through which the different species making up a gas mixture to be analysed are separated.

The sensor comprises a heating wire coupled to an electric power source enabling it to be heated by Joule effect, suspended in a volume in which one or more species to be detected are located.

Depending on the nature of the species in contact with the heating wire, and more precisely its thermal conductivity, heat exchanges between the heating wire and the species are likely to generate a temperature variation of the heating wire and consequently a variation in the electric resistance of the wire.

This change in electric resistance, as well as the electric resistance of an identical wire in contact with a reference gas, are measured using a Wheatstone bridge, for the purpose of determining the concentration of the species considered.

However, this technology has limits in that it requires a significant contrast in terms of thermal conductivity between the reference gas and the one or more species to be detected.

Additionally, the wire is generally made of platinum coated with nitride, which are materials having significant stress levels, inducing difficulties of implementation and limits in terms of sensor design. This technology is thus difficult to master in practice.

Another type of sensor based on the same measurement principle has been made on a silicon substrate by means of microfabrication techniques, enabling the heating wire to be directly etched in a silicon layer. This sensor type has been described in documents FR 2 995 691, FR 2 995 690 and FR 2 995 692. This technique has an advantage in terms of easy integration.

On the other hand, to have an appropriate electric resistance for the silicon wire, such a sensor should be made at the nanometre scale. As a result, the heat exchange area between the heating wire and the gas to be detected is very small, which limits said exchanges and the ability of the sensor to detect small gas concentrations.

Other sensors are based on different technologies. For example, document WO 2015/082956 describes an NEMS (acronym for "Nano Electro-Mechanical Systems") type resonator allowing the gas concentration to be measured by gravimetric effect, that is modification of the resonant frequency of the resonator due to a modification in the mass of the resonating structure.

Whatever the technology considered, improvements are expected in terms of sensitivity of the sensor and simple manufacturing.

DISCLOSURE OF THE INVENTION

A purpose of the invention is to design a heat flux sensor which is simple to manufacture, while ensuring a proper detection sensitivity.

To that end, the invention provides a heat flux sensor comprising:

an array of nanofilaments suspended with respect to a support, each nanofilament comprising an electrically conducting or semiconductor material, said array being able to be biased by an electric power source to circulate an electric current in each of said nanofilaments, at least one resonator of the nanoelectro-mechanical system (NEMS) type comprising:
  a beam consisting of a nanofilament forming a side of the array,
  an actuation device able to generate a vibration of said beam under the effect of an excitation signal,
  a detection device configured to measure a displacement of the beam during said vibration and emit an output signal having a resonance at the resonant frequency of the resonator, said resonant frequency depending on the intensity of the electric current flowing through the beam, a temperature variation of the array of heating nanofilaments induced by a variation in a characteristic of a fluid surrounding said array causing an intensity variation of the current flowing through the beam resulting in a variation in the resonant frequency of said resonator.

By "nanofilament", it is meant in the present text a nanometric size filament, that is one of the transverse dimensions of which (for example the diameter in the case of a round filament, or the width in the case of a rectangular cross-section filament) is lower than or equal to a few hundreds nm, for example lower than 500 nm.

Such a sensor is based on the fact that the resonant frequency of the resonator strongly depends on the intensity of the electric current flowing therethrough.

This sensor benefits from the measurement accuracy provided by NEMS resonators, while ensuring heat exchange with the gas to be detected which is sufficiently high by virtue of the array of heating nanofilaments, this heat exchange inducing a variation in the electric resistance of the nanofilaments and thus of the intensity of the electric current flowing therethrough.

According to advantageous but optional characteristics of the invention, possibly taken in combination:

the sensor comprises at least two resonators the beams of which are arranged along two opposite sides of the array of nanofilaments;

each nanofilament is embedded at its two ends into the support;

all the nanofilaments of the array have the same cross-section;

the cross-section of each nanofilament has a width and a thickness each between 10 and 500 nm;

each nanofilament is arranged at a distance from an adjacent nanofilament;

the distance between two adjacent nanofilaments is between 0.5 and 1.5 µm;

the beams have a different length from that of other nanofilaments;

each nanofilament is formed by a semiconductor material, such as silicon;

the resonators have a different doping level from that of other nanofilaments;

the support is formed by the same semiconductor material as the nanofilaments, and the support has a different doping level from that of the nanofilaments other than the beams;

the support is formed by a different material from that of the nanofilaments, said material being chosen to thermally insulate the array of nanofilaments and each resonator from the rest of the sensor;

the material of the support is porous;

the sensor further comprises a substrate with respect to which the support is suspended;

the support has a plurality of through holes extending transversally to a main surface of the substrate;

the nanofilaments other than the beams are connected to each other by bridges;

the number of nanofilaments is between 10 and 1000;

the actuation device is of the electrostatic type;

the detection device comprises a piezoresistive gauge integral with the beam.

The invention also relates to a gas sensor comprising a heat flux sensor as described above.

The invention also relates to a gas analysis system comprising a chromatography column and at least one sensor as described above arranged at the outlet of said chromatography column.

The invention also relates to a flowmeter comprising a heat flux sensor as described above.

DESCRIPTION OF THE FIGURES

Further characteristics and advantages of the invention will appear upon reading the following detailed description, in reference to the appended figures in which.

Identical reference signs from one figure to the other identify identical elements or fulfilling the same function. These elements are thus not described in detail again.

For reasons of legibility of the figures, the different elements of the sensor are not necessarily drawn to scale.

DETAILED DESCRIPTION OF EMBODIMENTS OF THE INVENTION

The heat flux sensor comprises an array of heating nanofilaments which are to be contacted with a fluid and exchange heat with said fluid to enable a characteristic thereof to be measured.

The heating nanofilaments comprise an electrically conducting material having a determined electric resistivity or a semiconductor material; they are connected, through a support, to an electric power source adapted to bring said nanofilaments to a determined temperature by Joule effect.

To optimise sensitivity of the sensor, the array of heating nanofilaments is designed to allow maximum heat exchange with the surrounding fluid and limit as much as possible heat loss with the support. Therefore, the heating nanofilaments are thus advantageously suspended with respect to the support, that is a free space is provided between each heating nanofilament and the support to enable the fluid to surround each heating nanofilament on all its faces and to maximise the contact area between the fluid and the heating nanofilament.

Thus, in the case of the application to a gas sensor, a modification in the composition of the gas surrounding the sensor modifies heat exchanges between the nanofilaments and the gas, and thus varies the temperature of the heating nanofilaments; the measurement of this temperature enables the gas composition to be deduced therefrom. In the case of the application to a flowmeter, a velocity variation of a gas flux surrounding the sensor modifies heat exchanges between the nanofilaments and the gas and thus also varies the temperature of the nanofilaments.

The heat flux sensor combines said array of heating nanofilaments to at least one nanoelectro-mechanical system (NEMS) type resonator arranged on a side of said array and integral with the support, said resonator acting as a temperature sensor.

In a manner known per se, such an NEMS resonator comprises a beam suspended with respect to the support, an actuation device able to generate a vibration of said beam under the effect of an excitation signal, and a detection device configured to measure a displacement of said beam during said vibration and emit an output signal having a resonance at the resonant frequency of the resonator, said resonant frequency depending on the temperature of the beam.

The beam is one of the heating nanofilaments of the array, more precisely a nanofilament located on a side of the array. Optionally, the sensor comprises two NEMS resonators, the respective beam of which is a nanofilament arranged on one side of the array. The advantage of the implementation of two resonators symmetrically arranged with respect to the array is to allow a differential measurement which simplifies detection signal processing and enables the signal to noise ratio to be improved upon detecting.

The material of the heating nanofilaments is characterised by a temperature coefficient of resistance (TCR), which defines the variation in its electric resistivity as a function of temperature. Consequently, a variation in the temperature of the array of heating nanofilaments by heat exchange with the surrounding fluid causes a variation in the electric resistance of the nanofilaments and thus a variation in the intensity of the electric current flowing therethrough. Since, the beam is biased at the same potential as the other nanofilaments, it also undergoes a variation in the electric current which flows therethrough, which strongly affects the resonant frequency of the resonator.

According to a preferred embodiment, the actuation device is of the electrostatic type. In this case, the actuation device comprises an electrode located on one side of the beam, at a distance from the same. This distance is in the order of a few hundreds nm.

According to a preferred embodiment, the detection device is of the piezoresistive type, as described in document FR 2 996 219. In this case, a piezoresistive strain gauge is located on one side of the beam, at a distance from its two ends. The dimensions of this gauge are typically a few tens to a few hundreds nm width and thick and a few hundreds nm to a few μm long. However, those skilled in the art could choose any other type of detection, for example capacitive, piezoelectric, magnetic, optical, etc.

Figure 1:
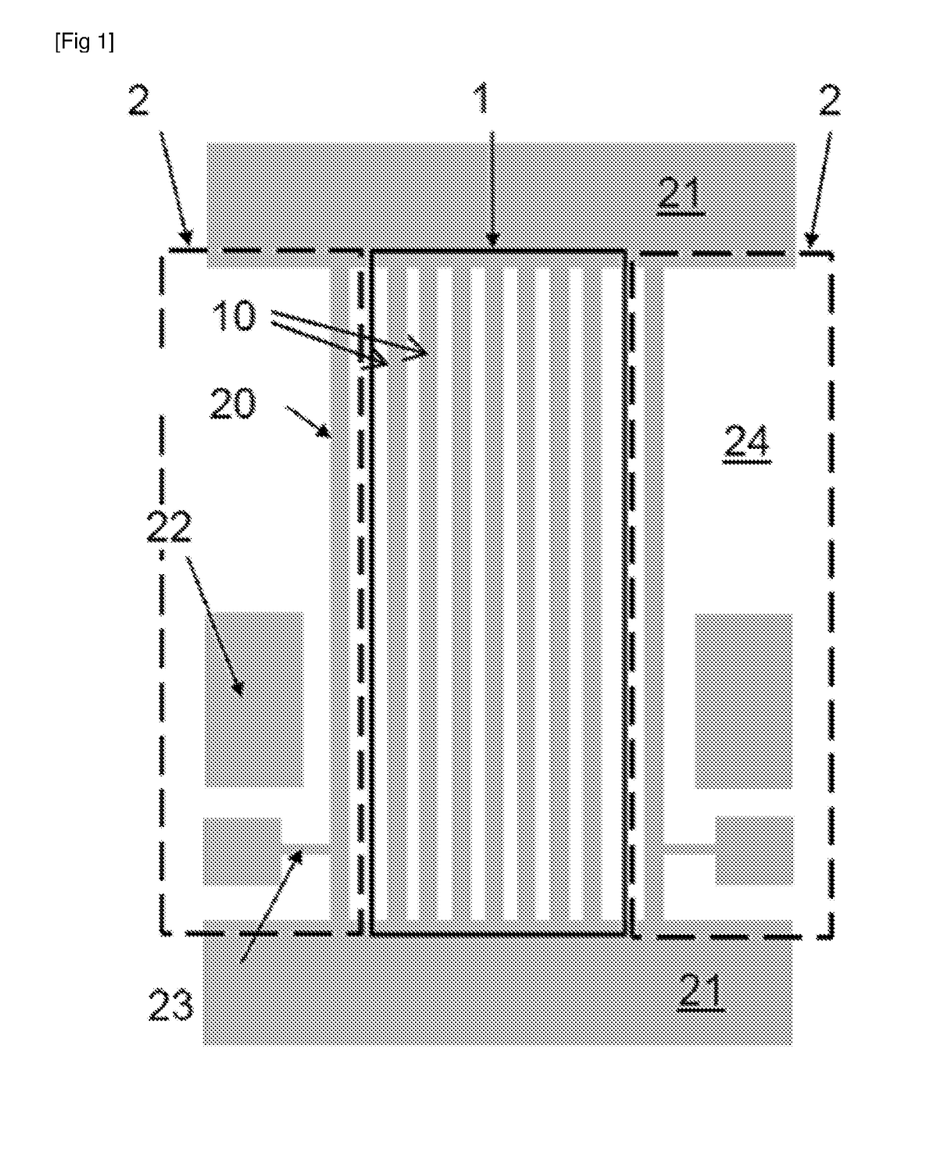
FIG. 1 is a diagram of a heat flux sensor according to a first embodiment of the invention.

FIG. 1 illustrates one embodiment of the heat flux sensor, comprising two NEMS resonators arranged on either side of the array of heating nanofilaments.

The array 1 comprises nanofilaments 10 and two beams 20 which are two nanofilaments forming both sides of the array. Each nanofilament is embedded at each of its two ends into a support 21.

Besides the beam 20, each resonator 2 comprises an actuation device, represented as an electrode 22 in the illustrated embodiment, as well as a detection device comprising a piezoresistive gauge 23. Both resonators are symmetric relative to a longitudinal axis of the array 1.

The array of nanofilaments is configured to have a high sensitivity. To that end, the number and dimension of the nanofilaments are chosen such that the array has a large heat exchange area with the surrounding fluid. Thus, the number of heating nanofilaments is typically between 10 and 1000. On the other hand, each heating nanofilament is arranged at a distance from an adjacent heating nanofilament. For example, the distance between two adjacent nanofilaments is between 0.5 and 1.5 μm, for example in the order of 1 μm. Additionally, the junction between the heating nanofilaments and their support is dimensioned to minimise heat losses at this junction.

Typical dimensions for the nanofilaments are the following ones: a cross-section the width and the height of which are of a few tens to a few hundred nanometer per side, and a length of a few μm to a few tens μm.

The heating nanofilaments can consist of a semiconductor material, such as silicon (single crystal or polycrystalline, doped or not), germanium, silicon-germanium (Site). Optionally, the silicon can be porous, the porosity enabling heat exchanges with the surrounding environment to be increased. Advantageously, the beams are made in the same material as the heating nanofilaments, optionally with different doping levels chosen such that the electric resistance of the heating nanofilaments is higher than that of the beam.

The fact that the beam of each NEMS resonator consists of a heating nanofilament does not imply that said beam has necessarily same dimensions as the other heating nanofilaments. Generally, the cross-section of the beams is in the same order of magnitude as that of the nanofilaments because the beams and the nanofilaments are preferably made with the same technology. As regards the length of the beams, it can be identical to that of the nanofilaments or different. Indeed, the choice of the resonant frequency of the resonator can require the choice of a beam length different from the length of the other heating nanofilaments. Typically, the resonant frequency of each resonator is of a few MHz to a few hundred MHz.

Although the heating nanofilaments are represented as rectilinear and parallel to each other on the appended figures, other embodiments are possible. For example, the nanofilaments may not be parallel to each other; additionally, the nanofilaments can have a non-rectilinear shape, for example a coil shape, which enables the length of the heating nanofilaments to be increased while relieving possible compression stresses.

Figure 2:
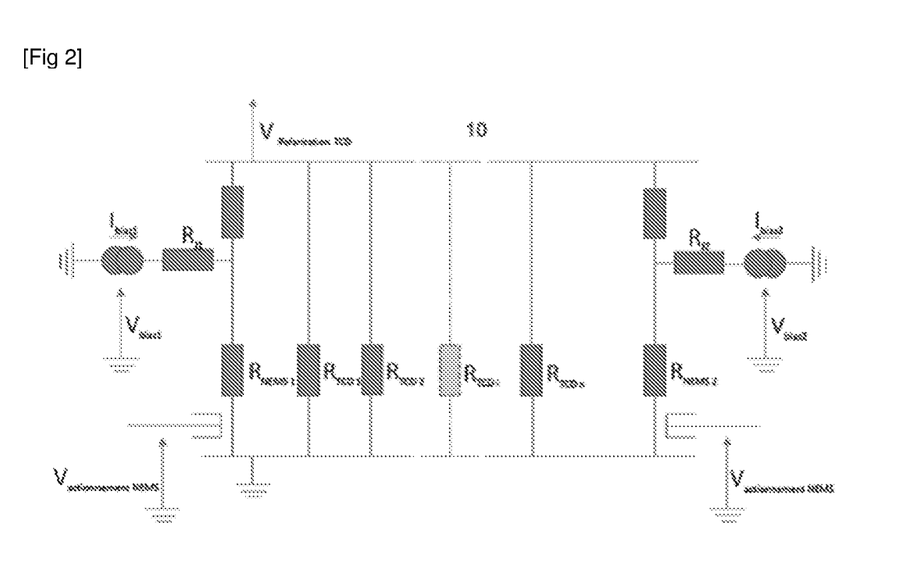
FIG. 2 illustrates the circuit diagram of the measurement of a sensor according to the invention.

FIG. 2 is a circuit diagram of the heat flux sensor.

In this circuit diagram, each heating nanofilament is represented as an electric resistance noted $R_{TCD\ i}$ for the $i^{th}$ nanofilament, i being an integer ranging from 1 to n (n being the total number of heating nanofilaments excluding the nanofilaments forming the beams of the resonators). All the electric resistances have substantially the same value since the nanofilaments have identical dimensions and are made of the same material.

In the circuit diagram, each beam is represented as an electric resistance noted $R_{NEMS\ 1}$ or $R_{NEMS\ 2}$. All the beams and heating nanofilaments are arranged in parallel and connected through one end to a first potential (for example to the ground) and through the opposite end to a second potential, called $V_{bias\ TCD}$.

Each beam is vibrationally actuated at its resonant frequency by an electrode brought to a potential $V_{activation\ NEMS}$. Each piezoresistive gauge is represented as an electric resistance noted $R_{J1}$ or $R_{J2}$. Each gauge is biased in current the intensity of which is respectively noted $I_{bias1}$ or $I_{bias2}$.

If $I_{bias1}$ (or $I_{bias2}$) is very small relative to the product of $R_{NEMS\ 1}$ (or $R_{NEMS\ 2}$) and $V_{bias\ TCD}$, which is equal to the product of $R_{TCD\ i}$ and $V_{bias\ TCD}$, then it is considered that $R_{NEMS\ 1}$ (or $R_{NEMS\ 2}$) is equal to $R_{TCD\ i}$.

Upon detecting a gas, the temperature of the array of nanofilaments decreases and the electric current flowing through the array of heating nanofilaments and the beams varies as the electric resistances $R_{TCD\ i}=R_{NEMS\ 1}=R_{NEMS\ 2}$. This intensity variation of the electric current generates a variation in the resonant frequency which is measured by the piezoresistive gauges.

For manufacturing this sensor, documents FR 2 995 690 and FR 3 008 690 can be referred to, which describe a method for manufacturing a heating wire and a method for manufacturing an NEMS resonator respectively.

A preferred manufacturing method is based on a semiconductor on insulator (SOI) substrate. Such an SOI substrate successively comprises, from its surface, a thin layer of single crystal silicon (a few hundred nanometres thick), a buried dielectric layer (for example a layer of silicon oxide ($SiO_2$) and a base substrate, for example of silicon, which acts as a mechanical support for the sensor.

This method implements conventional microelectronics techniques, in particular photolithography, implantation, deposition and etching techniques.

In the thin silicon layer, species chosen to achieve the desired electric resistivity in the zones for forming the heating nanofilaments and the resonator(s) (beam, strain gauges, actuation electrodes) respectively are implanted. These electric resistivities can optionally be different between both zones.

Then, the mechanical structures (heating nanofilaments, resonator(s) (beam, strain gauges, actuation electrodes), embeddings, etc.) are anisotropically etched in the superficial thin silicon layer. The heating nanofilaments and resonator are thus formed as a single piece with the support in said thin layer, and thus have the same thickness. The embeddings are advantageously made large enough to ensure a proper mechanical strength relative to the support after releasing the mechanical structures. The embeddings thus typically have sides of several μm to tens μm.

Then, by successive steps of depositing and etching electrically insulating layers ($SiO_2$) and electrically conducting layers (AlSi preferably for interconnections), the metal interconnections between the mechanical structures of doped silicon are made.

A planarising layer can then be optionally formed so as to facilitate the subsequent step of packaging the components by bonding a cap.

After this planarising layer has been locally opened (by anisotropic etching) above the mechanical structures to be released, an isotropic etching of the buried silicon oxide layer of the SOI substrate is made to release the mechanical structures of silicon to be suspended (heating nanofilaments, resonator(s)) to the base substrate. The oxide layer is however not etched—or is only partially etched—at the embeddings.

A cap including an etched channel can then be bonded above this structure, thus creating a fluidic channel in which the gas mixture to be analysed will flow.

Said channel can be fluidly connected to the outlet of a gas chromatography column if such a column is implemented upstream of the sensor to separate and identify the compounds of the gas mixture.

Alternatively, the sensor can be used in a flowmeter to measure a gas flow rate.

Naturally, those skilled in the art could choose any other manufacturing method without departing from the scope of the present invention.

Figure 3:
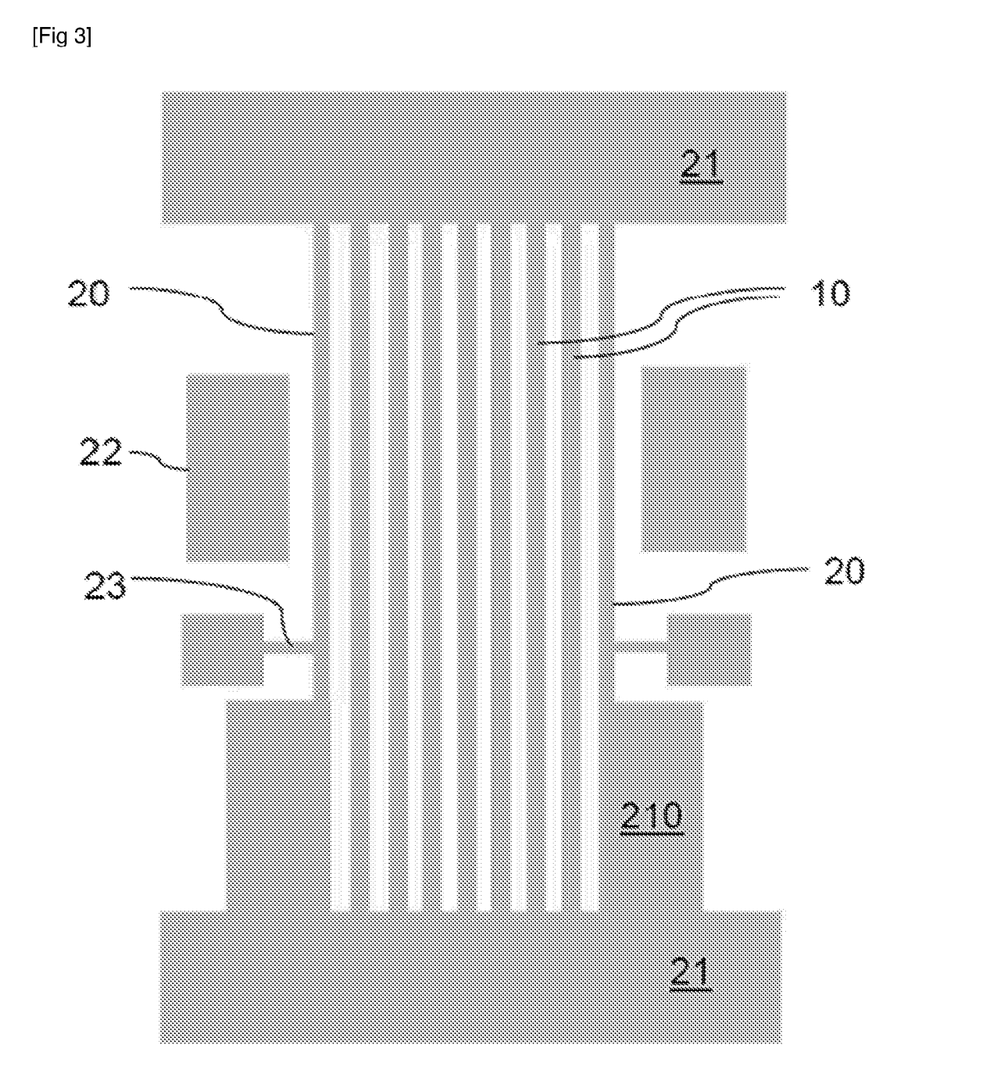
FIG. 3 is a diagram of a sensor according to a second embodiment of the invention.

FIG. 3 is a schematic diagram of a heat flux sensor according to one alternative of the sensor of FIG. 1. With respect to the embodiment of FIG. 1, the beams 20 have a different length (lower in the figure) from that of the nanofilaments 10. To that end, one of the supports 21 into which the nanofilaments are embedded has an extension 210. One end of the beams is embedded into said extension 210 whereas the other end is embedded in the opposite support 21.

The array of nanofilaments and the resonators can thus be separately optimised.

Figure 4:
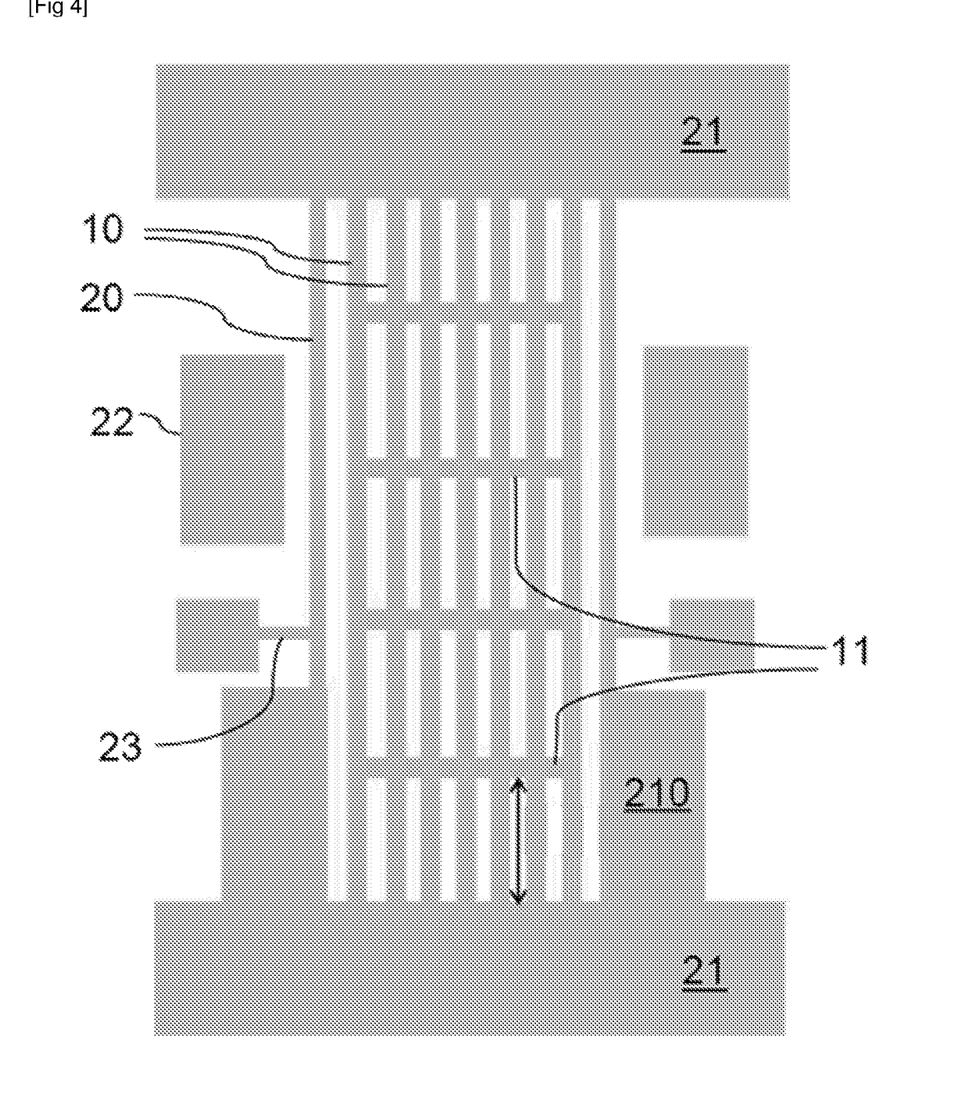
FIG. 4 is a diagram of a sensor according to a third embodiment of the invention.

FIG. 4 is a schematic diagram of a heat flux sensor according to one alternative of the sensor of FIG. 3. With respect to the embodiment of FIG. 3, the nanofilaments 10 are mechanically connected by bridges 11 which increase the mechanical rigidity of the array 1. Said bridges are advantageously made as a single piece with the nanofilaments upon manufacturing the array. The bridges advantageously extend perpendicular to the nanofilaments, although other arrangements of the bridges are contemplatable. For example, the bridges can extend parallel to each other with a distance in the order of 10 µm between two adjacent bridges. On the other hand, the beams are not connected to other nanofilaments by such bridges, in order not to rigidify the beams and thus modify their resonant frequency and decrease the sensitivity of the resonators.

Figure 5:
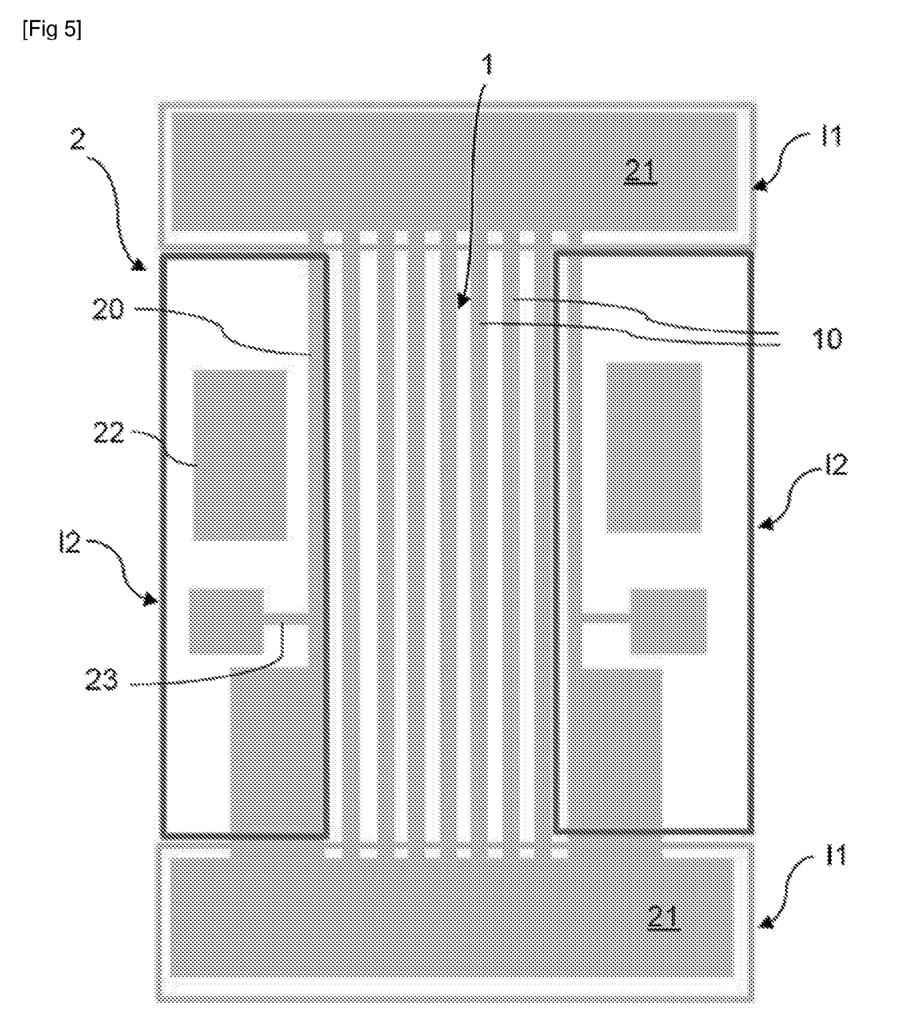
FIG. 5 is a diagram of a sensor according to a fourth embodiment of the invention.

FIG. 5 is a schematic diagram of a heat flux sensor according to one alternative of the sensor of FIG. 3. With respect to the embodiment of FIG. 3, the semiconductor material of the support 21, that of the resonators 2 (beams 20 and nanogauges 23) and that of the array of nanofilaments are implanted in a differentiated way in order to adjust the electric resistances in a differentiated way. A strong resistance could for example be demanded at the nanofilaments 10 which have to be heated, a lower resistance at the supports 21 of the nanofilaments and an intermediate resistance at the resonators 2 by also taking into consideration that the doping level of the nanogauges 23 influences the piezoresistive coefficient of the material and thus the detection signal of resonance. Implantation zones are depicted by the rectangles 11, 12.

Figure 6:
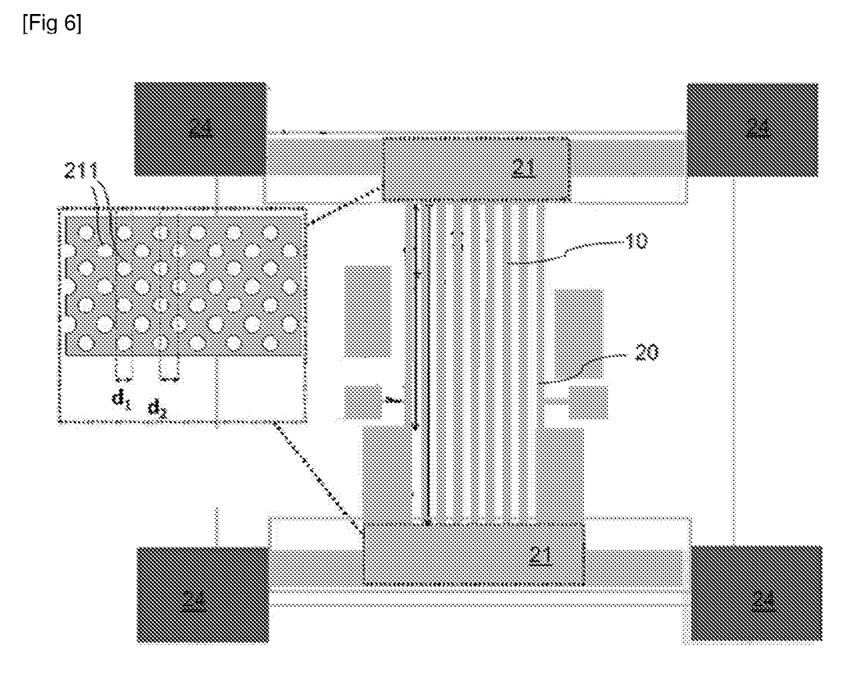
FIG. 6 is a diagram of a sensor according to a fifth embodiment of the invention.

FIG. 6 is a schematic diagram of a particular implementation of the heat flux sensor. The structure consisting of the array of nanofilaments 10, the resonator 2 and the support 21 is suspended with respect to a substrate 24, which enables heat losses to be limited at the embeddings. Particularly advantageously, the support 21 has a plurality of through holes 211 extending transversally to a main surface of the substrate 24. These holes 211 are distributed on at least one part of the surface of the support 21. These holes can be used during the method for manufacturing the sensor, to facilitate etching of a sacrificial layer arranged under the support and the heating nanofilaments for releasing the array of nanofilaments and the support and suspend them with respect to the substrate. In the illustrated example, each hole 211 has a diameter $d^1$ in the order of 0.5 µm and is separated from an adjacent hole by a distance $d_2$ in the order of 2 µm. Even if FIG. 6 illustrates holes with an identical size and evenly distributed on the surface of the support, it is also contemplatable to vary the diameter of the holes and/or their distribution density in order to locally adjust the electric resistance of the support.

The different embodiments described above can be combined when this is technically feasible.

REFERENCES

U.S. Pat. No. 8,313,236
FR 2 995 691
FR 2 995 690
FR 2 995 692
WO 2015/082956
FR 2 996 219
FR 3 008 690

The invention claimed is:

1. A heat flux sensor comprising:
   an array of nanofilaments suspended with respect to a support, each nanofilament comprising an electrically conducting or semiconductor material, said array being able to be biased by an electric power source to circulate an electric current in each of said nanofilaments,
   at least one resonator of the nanoelectro-mechanical system (NEMS) type comprising:
   a beam consisting of a nanofilament forming a side of the array,
   an actuation device able to generate a vibration of said beam under the effect of an excitation signal,
   a detection device configured to measure a displacement of the beam during said vibration and emit an output signal having a resonance at the resonant frequency of the resonator, said resonant frequency depending on the intensity of the electric current flowing through the beam, a temperature variation of the array of heating nanofilaments induced by a variation in a characteristic of a fluid surrounding said array causing an intensity variation of a current flowing through the beam resulting in a variation in the resonant frequency of said resonator.

2. The sensor of claim 1, comprising at least two resonators the beams of which are arranged along two opposite sides of the array of nanofilaments.

3. The sensor of claim 1, wherein each nanofilament is embedded at both ends into the support.

4. The sensor of claim 1, wherein all the nanofilaments of the array have a same cross-section.

5. The sensor of claim 1, wherein the cross-section of each nanofilament has a width and a thickness each between 10 and 500 nm.

6. The sensor of claim 1, wherein each nanofilament is arranged at a distance from an adjacent nanofilament.

7. The sensor of claim 6, wherein the distance between two adjacent nanofilaments is between 0.5 and 1.5 µm.

8. The sensor of claim 1, wherein the beams have a different length from a length of the other nanofilaments.

9. The sensor of claim 1, wherein each nanofilament is formed by a semiconductor material, such as silicon.

10. The sensor of claim 9, wherein each resonator has a different doping level from a doping level of the other nanofilaments.

11. The sensor of claim 9, wherein the support is formed by the same semiconductor material as the nanofilaments, and the support has a different doping level from the doping level of the nanofilaments other than the beams.

12. The sensor of claim 1, wherein the support is formed by a different material from the material of the nanofilaments, said material being chosen to thermally insulate the array of nanofilaments and each resonator from the rest of the sensor.

13. The sensor of claim 12, wherein the material of the support is porous.

14. The sensor of claim 1, further comprising a substrate with respect to which the support is suspended.

15. The sensor of claim 14, wherein the support has a plurality of through holes extending transversally to a main surface of the substrate.

16. The sensor of claim 1, wherein the nanofilaments other than the beams are connected to each other through bridges.

17. The sensor of claim 1, wherein the number of nanofilaments is between 10 and 1000.

18. The sensor of claim 1, wherein the actuation device is of the electrostatic type.

19. The sensor of claim 1, wherein the detection device comprises a piezoresistive gauge integral with the beam.

20. A gas sensor comprising the heat flux sensor of claim 1.

21. A gas analysis system comprising a chromatography column and at least one sensor of claim 1 arranged at an outlet of said chromatography column.

22. A flowmeter comprising the heat flux sensor of claim 1.

* * * * *